(12) United States Patent
Verma et al.

(10) Patent No.: US 10,679,944 B2
(45) Date of Patent: Jun. 9, 2020

(54) SEMICONDUCTOR STRUCTURE WITH HIGH RESISTIVITY WAFER AND FABRICATING METHOD OF BONDING THE SAME

(71) Applicant: UNITED MICROELECTRONICS CORP., Hsin-Chu (TW)

(72) Inventors: Purakh Raj Verma, Singapore (SG); Kuo-Yuh Yang, Hsinchu County (TW); Chia-Huei Lin, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 96 days.

(21) Appl. No.: 16/167,501

(22) Filed: Oct. 22, 2018

(65) Prior Publication Data

US 2020/0098690 A1 Mar. 26, 2020

(30) Foreign Application Priority Data

Sep. 21, 2018 (CN) .......................... 2018 1 1105432

(51) Int. Cl.
*H01L 23/532* (2006.01)
*H01L 23/00* (2006.01)
*H01L 23/522* (2006.01)
*H01L 23/31* (2006.01)
*H01L 23/29* (2006.01)
*H01L 21/00* (2006.01)
*H01L 21/02* (2006.01)

(52) U.S. Cl.
CPC .... *H01L 23/5329* (2013.01); *H01L 21/02123* (2013.01); *H01L 21/02164* (2013.01); *H01L 21/02381* (2013.01); *H01L 21/02422* (2013.01); *H01L 23/291* (2013.01); *H01L 23/3107* (2013.01); *H01L 23/5226* (2013.01); *H01L 24/09* (2013.01); *H01L 24/17* (2013.01); *H01L 24/73* (2013.01); *H01L 24/80* (2013.01); *Y10T 156/10* (2015.01)

(58) Field of Classification Search
CPC . Y10T 156/10; H01L 23/291; H01L 23/3107; H01L 21/02381; H01L 21/02422; H01L 21/02123; H01L 21/02164
USPC ..................................... 257/455, 459; 156/60
See application file for complete search history.

(56) References Cited

U.S. PATENT DOCUMENTS

| | | | | |
|---|---|---|---|---|
| 4,930,353 A | * | 6/1990 | Kato | G01L 9/06 338/4 |
| 5,032,544 A | * | 7/1991 | Ito | H01L 21/2007 148/DIG. 12 |
| 5,115,292 A | * | 5/1992 | Takebe | G01P 15/0802 257/254 |
| 5,371,037 A | * | 12/1994 | Yonehara | H01L 21/76243 117/10 |
| 5,387,555 A | | 2/1995 | Linn | |
| 5,686,360 A | * | 11/1997 | Harvey, III | H01L 51/0097 438/28 |

(Continued)

*Primary Examiner* — Victoria K. Hall
(74) *Attorney, Agent, or Firm* — Winston Hsu (57) ABSTRACT

A semiconductor structure with a high resistivity wafer includes a device wafer. The device wafer includes a front side and a back side. A semiconductor element is disposed on the front side. An interlayer dielectric covers the front side. A high resistivity wafer consists of an insulating material. A dielectric layer encapsulates the high resistivity wafer. The dielectric layer contacts the interlayer dielectric.

20 Claims, 8 Drawing Sheets

(56) References Cited

U.S. PATENT DOCUMENTS

| | | | | |
|---|---|---|---|---|
| 5,834,812 A * | 11/1998 | Golland | H01L 21/76251 | 257/347 |
| 6,214,702 B1 * | 4/2001 | Kim | H01L 21/2007 | 438/459 |
| 6,468,923 B1 * | 10/2002 | Yonehara | C25D 11/32 | 438/761 |
| 6,844,242 B2 * | 1/2005 | Naruoka | H01L 21/67092 | 206/710 |
| 6,959,490 B2 * | 11/2005 | Miyata | B41J 2/161 | 216/27 |
| 7,332,412 B2 * | 2/2008 | Park | H01L 21/32134 | 257/19 |
| 8,298,916 B2 * | 10/2012 | Vaufredaz | H01L 21/76256 | 438/459 |
| 8,329,048 B2 * | 12/2012 | Zussy | H01L 21/76251 | 216/36 |
| 8,441,136 B2 * | 5/2013 | Chiou | H01L 21/561 | 257/790 |
| 8,628,674 B2 * | 1/2014 | Zussy | H01L 21/76251 | 216/36 |
| 8,679,944 B2 * | 3/2014 | Broekaart | H01L 21/304 | 257/E21.237 |
| 8,759,126 B2 * | 6/2014 | Kuranaga | G02F 1/133351 | 257/88 |
| 8,815,641 B2 * | 8/2014 | Jerome | H01L 21/02381 | 438/105 |
| 9,214,337 B2 * | 12/2015 | Carroll | H01L 23/293 | |
| 9,583,414 B2 * | 2/2017 | Costa | H01L 23/3737 | |
| 9,812,350 B2 * | 11/2017 | Costa | H01L 23/293 | |
| 9,824,951 B2 * | 11/2017 | Leipold | H01L 21/0217 | |
| 9,853,133 B2 * | 12/2017 | Thomas | H01L 29/66833 | |
| 10,026,642 B2 * | 7/2018 | Kweskin | H01L 21/31111 | |
| 10,062,637 B2 * | 8/2018 | Costa | H01L 21/0237 | |
| 10,109,548 B2 * | 10/2018 | Leipold | H01L 23/315 | |
| 10,115,774 B2 * | 10/2018 | Kuriyagawa | H01L 51/5253 | |
| 10,121,718 B2 * | 11/2018 | Leipold | H01L 23/315 | |
| 10,134,627 B2 * | 11/2018 | Costa | H01L 23/293 | |
| 10,192,778 B2 * | 1/2019 | Kweskin | H01L 21/76254 | |
| 10,199,301 B2 * | 2/2019 | Leipold | H01L 23/315 | |
| 10,312,134 B2 * | 6/2019 | Liu | H01L 29/0649 | |
| 10,483,152 B2 * | 11/2019 | Peidous | H01L 21/76254 | |
| 10,497,609 B2 * | 12/2019 | Fournel | H01L 21/02021 | |
| 10,529,615 B2 * | 1/2020 | Meguro | H01L 21/02233 | |
| 10,553,474 B1 * | 2/2020 | Wu | H01L 21/32139 | |
| 2002/0024096 A1 * | 2/2002 | Yamazaki | H01L 51/524 | 257/359 |
| 2002/0090758 A1 * | 7/2002 | Henley | H01L 21/26506 | 438/110 |
| 2006/0118870 A1 * | 6/2006 | Park | H01L 21/32134 | 257/347 |
| 2007/0032040 A1 * | 2/2007 | Lederer | H01L 21/76254 | 438/455 |
| 2009/0092810 A1 * | 4/2009 | Lee | H01L 21/3226 | 428/220 |
| 2011/0156062 A1 * | 6/2011 | Kim | H01L 51/0097 | 257/88 |
| 2013/0248891 A1 * | 9/2013 | Kim | H01L 51/5221 | 257/88 |
| 2014/0159078 A1 * | 6/2014 | Kim | H01L 51/0013 | 257/89 |
| 2014/0252535 A1 * | 9/2014 | Hurwitz | H01L 21/762 | 257/506 |
| 2014/0252566 A1 * | 9/2014 | Kerr | H01L 21/0237 | 257/635 |
| 2014/0252567 A1 * | 9/2014 | Carroll | H01L 21/0237 | 257/635 |
| 2014/0306324 A1 * | 10/2014 | Costa | H01L 23/3737 | 257/632 |
| 2015/0115416 A1 * | 4/2015 | Costa | H01L 23/3737 | 257/632 |
| 2015/0115480 A1 * | 4/2015 | Peidous | H01L 21/76251 | 257/798 |
| 2015/0123106 A1 * | 5/2015 | Yasumoto | B32B 43/006 | 257/40 |
| 2015/0255368 A1 * | 9/2015 | Costa | H01L 23/293 | 257/506 |
| 2015/0371905 A1 * | 12/2015 | Carroll | H01L 21/84 | 257/351 |
| 2016/0071760 A1 * | 3/2016 | Liu | H01L 21/02167 | 257/506 |
| 2016/0079137 A1 * | 3/2016 | Leipold | H01L 21/31111 | 257/790 |
| 2016/0118416 A1 * | 4/2016 | Yamazaki | H01L 27/1218 | 349/38 |
| 2016/0126111 A1 * | 5/2016 | Leipold | H01L 23/315 | 438/126 |
| 2016/0147109 A1 * | 5/2016 | Yamazaki | G02F 1/133512 | 349/42 |
| 2016/0190055 A1 * | 6/2016 | Jinbo | H01L 27/3276 | 257/99 |
| 2016/0351437 A1 * | 12/2016 | Peidous | H01L 21/76251 | |
| 2017/0032957 A1 * | 2/2017 | Costa | H01L 23/3737 | |
| 2017/0033002 A1 * | 2/2017 | Meguro | H01L 21/76254 | |
| 2017/0040569 A1 * | 2/2017 | Watabe | H01L 51/5253 | |
| 2017/0047547 A1 * | 2/2017 | Son | H01L 51/5253 | |
| 2017/0179386 A1 * | 6/2017 | Watabe | H01L 51/003 | |
| 2017/0256442 A1 * | 9/2017 | Kweskin | H01L 21/76254 | |
| 2017/0271200 A1 * | 9/2017 | Costa | H01L 23/293 | |
| 2017/0288055 A1 * | 10/2017 | Aktas | H01L 27/1203 | |
| 2017/0316968 A1 * | 11/2017 | Peidous | H01L 21/76254 | |
| 2018/0069079 A1 * | 3/2018 | Fanelli | H01L 29/408 | |
| 2018/0114720 A1 * | 4/2018 | Wang | H01L 29/78603 | |
| 2018/0122639 A1 * | 5/2018 | Kobayashi | H01L 27/12 | |
| 2018/0197769 A1 * | 7/2018 | Kweskin | H01L 21/76254 | |
| 2019/0006177 A1 * | 1/2019 | Wang | H01L 33/12 | |
| 2019/0164811 A1 * | 5/2019 | Kweskin | H01L 21/324 | |
| 2019/0252253 A1 * | 8/2019 | Verma | H01L 29/78618 | |
| 2020/0006385 A1 * | 1/2020 | Cheng | H01L 21/02667 | |
| 2020/0058746 A1 * | 2/2020 | Wu | H01L 21/02238 | |
| 2020/0075514 A1 * | 3/2020 | Verma | H01L 24/13 | |

* cited by examiner

SEMICONDUCTOR STRUCTURE WITH HIGH RESISTIVITY WAFER AND FABRICATING METHOD OF BONDING THE SAME

BACKGROUND OF THE INVENTION

1. Field of the Invention

The present invention relates to a semiconductor substrate with a high resistivity wafer and a method of fabricating the same, and more particularly to a method and a structure using glass or quartz as a high resistivity wafer.

2. Description of the Prior Art

Semiconductor-on-insulator (SOI) substrates are widely used as substrates for radio frequency (RF) devices. For example, field effect transistors are employed as a switching device for RF signals in analog and RF applications. The RF devices on the RF SOI substrate are generally applied to wireless communication, mobile phones etc. SOI substrates are typically employed for such applications, since parasitic coupling between devices through the substrate is reduced due to the low dielectric constant of a buried insulator layer.

An SOI substrate includes an insulator layer on a silicon substrate and a semiconductor material layer on the insulator layer. In an RF circuit, the silicon layer enables active components to be wired together using any standard IC technology. With the advent of 5G cellular mobile communication, however, the resistivity of a traditional SOI substrate is not high enough for RF devices.

SUMMARY OF THE INVENTION

Accordingly, the present invention provides a semiconductor structure with a high resistivity wafer to replace the traditional radio frequency (RF) silicon-on-insulator (SOI) substrate.

According to a preferred embodiment of the present invention, a device wafer comprises a front side and a back side, a semiconductor element disposed on the front side, an interlayer dielectric layer covering the front side, and a high resistivity wafer consisting of an insulating material and a dielectric layer encapsulating the high resistivity wafer, wherein the dielectric layer contacts the interlayer dielectric layer.

According to another preferred embodiment of the present invention, a semiconductor structure with a high resistivity wafer includes a device wafer comprising a front side and a back side, a semiconductor element disposed on the front side, an interlayer dielectric layer covering the front side, a metal interconnection disposed in the interlayer dielectric layer, a high resistivity wafer consisting of an insulating material, and a dielectric layer encapsulating the high resistivity wafer, wherein the dielectric layer contacts the interlayer dielectric layer and a conductive pad disposed on the back side, wherein the conductive pad electrically connects to the metal interconnection.

According to another preferred embodiment of the present invention, a method of bonding a high resistivity wafer includes providing a device wafer and a high resistivity wafer, wherein the device wafer comprises a first front side, the high resistivity wafer comprises a second front side and the high resistivity wafer consists of an insulating material, and wherein an interlayer dielectric layer covers the first front side. Next, a dielectric layer is formed to contact and encapsulate the high resistivity wafer. Then, a conductive layer is formed to encapsulate the dielectric layer. Later, the conductive layer on the second front side is removed to expose the dielectric layer on the second front side. Subsequently, a bonding process is performed. The bonding process includes bonding the dielectric layer on the second front side to the interlayer dielectric layer. After the bonding process, the conductive layer is entirely removed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 schematically depict a method of bonding a high resistivity wafer according to a preferred embodiment of the present invention, wherein:

DETAILED DESCRIPTION

Figure 1:
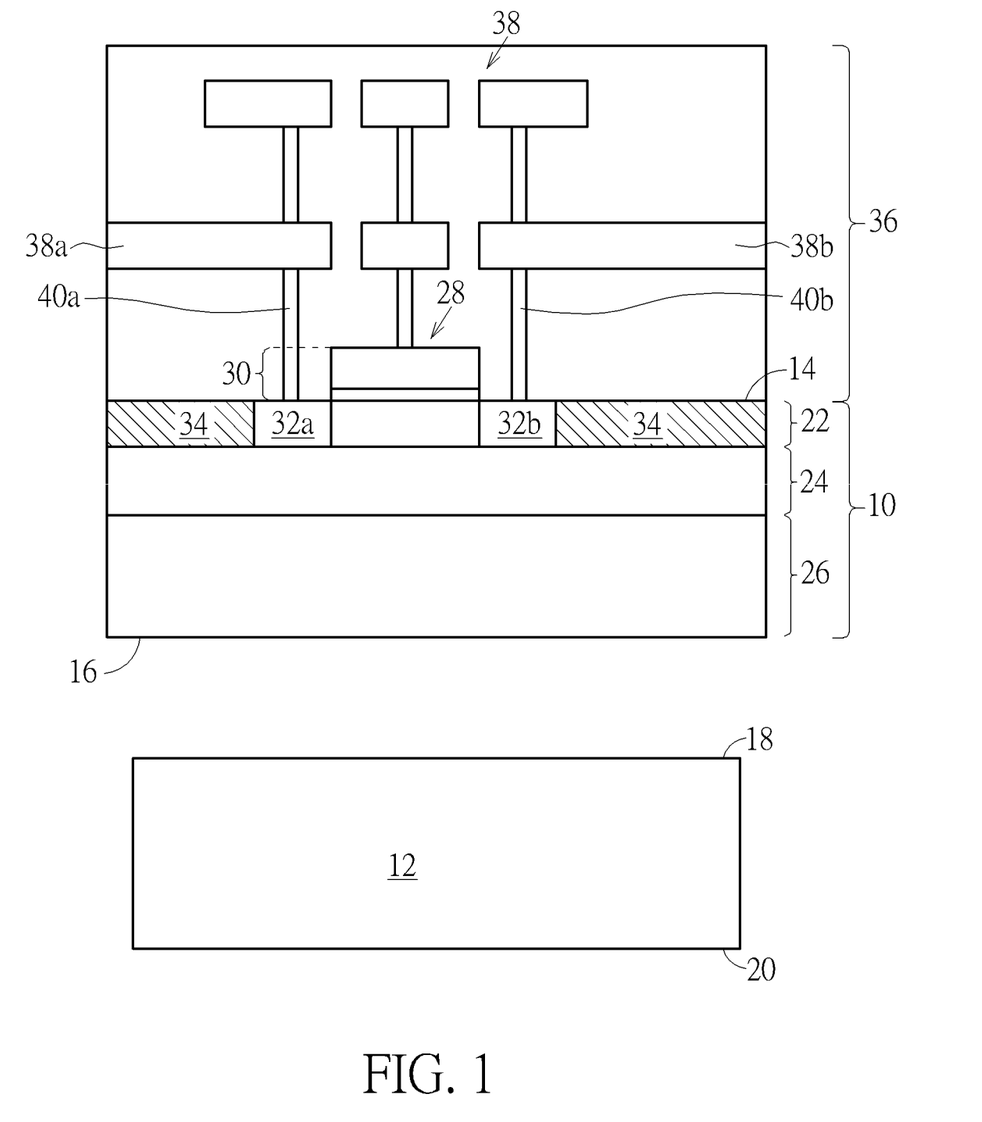
FIG. 1 depicts a device wafer and a high resistivity wafer.
Figure 7:
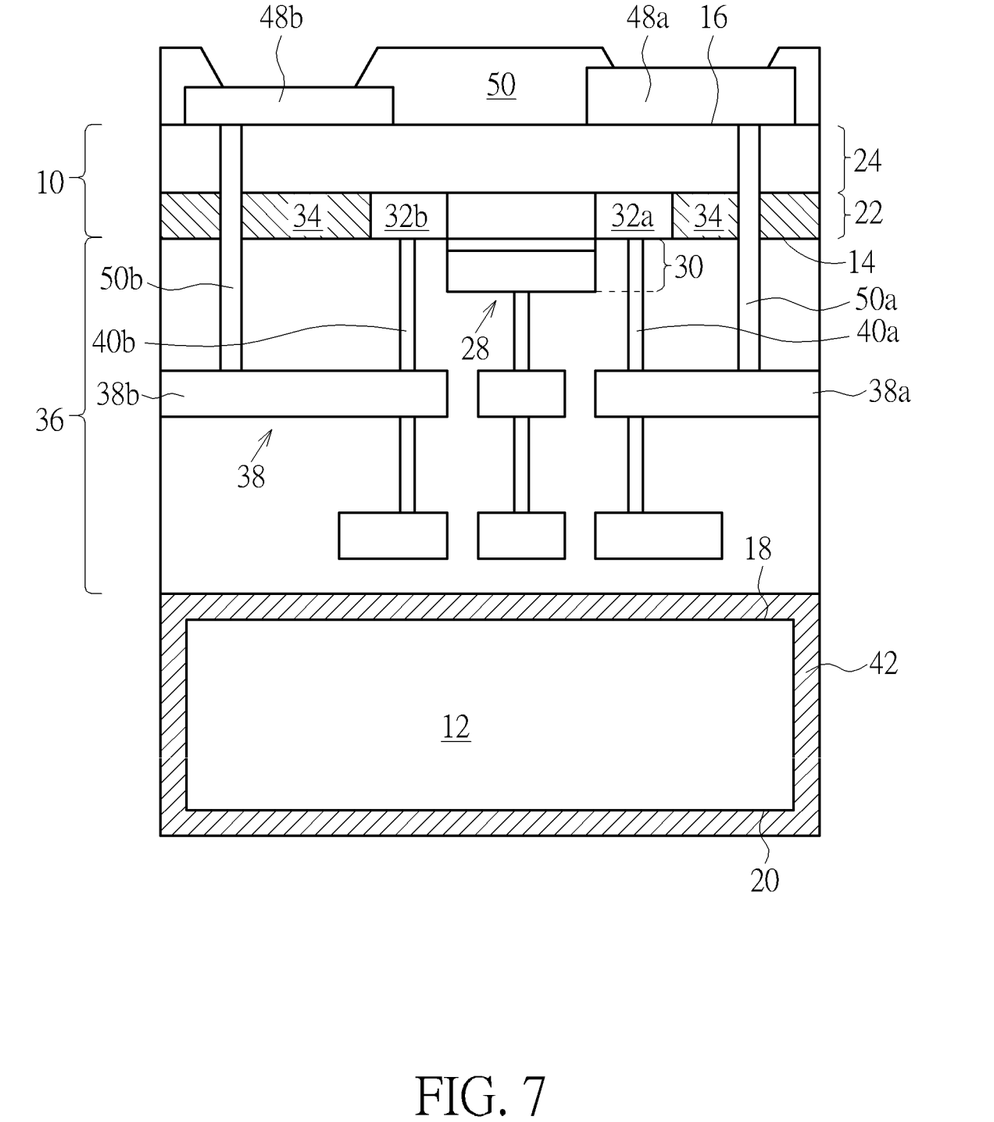
FIG. 7 depicts a fabricating stage subsequent to FIG. 6.
Figure 8:
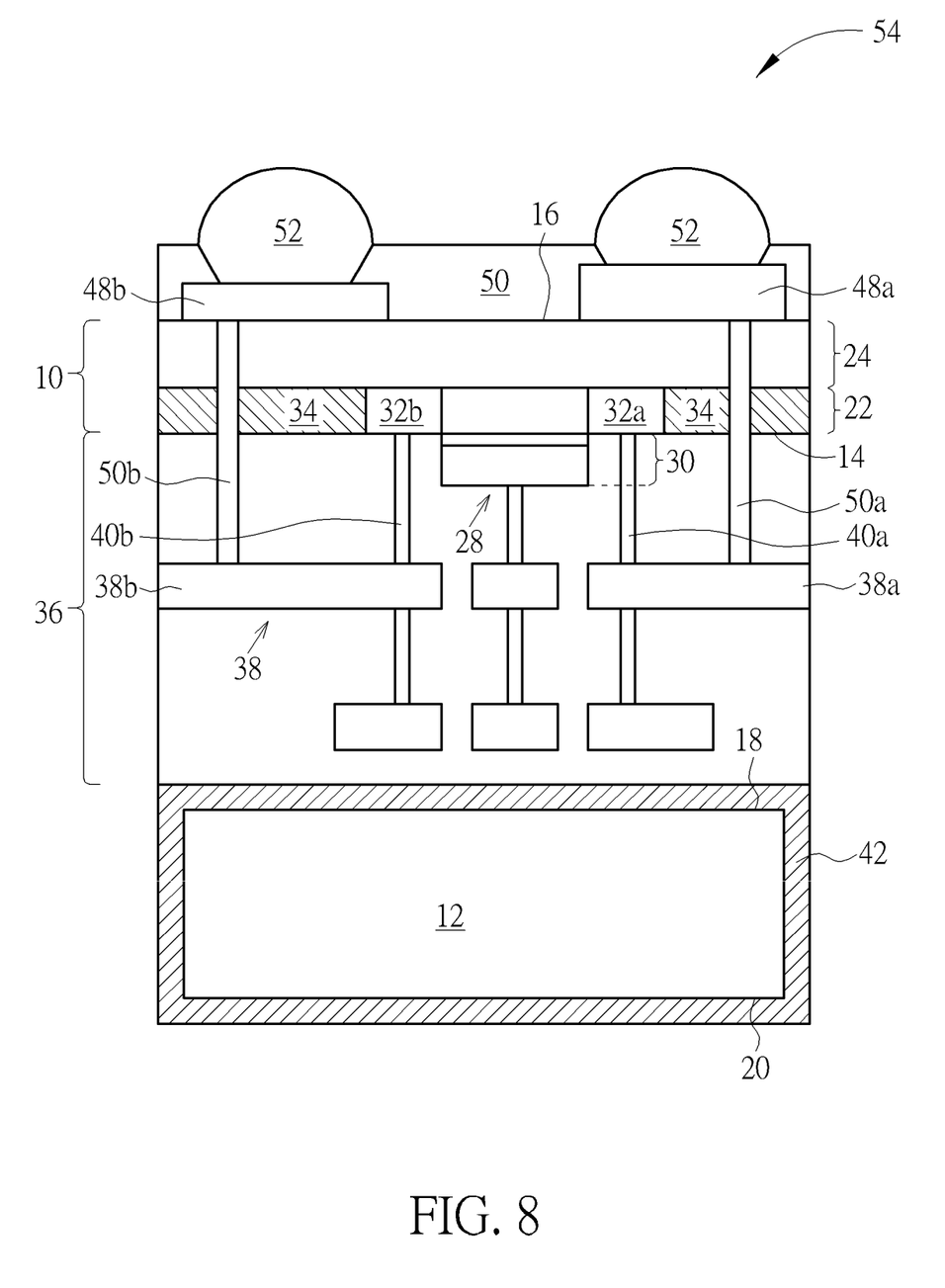
FIG. 8 depicts a fabricating stage subsequent to FIG. 7.
Figure 9:
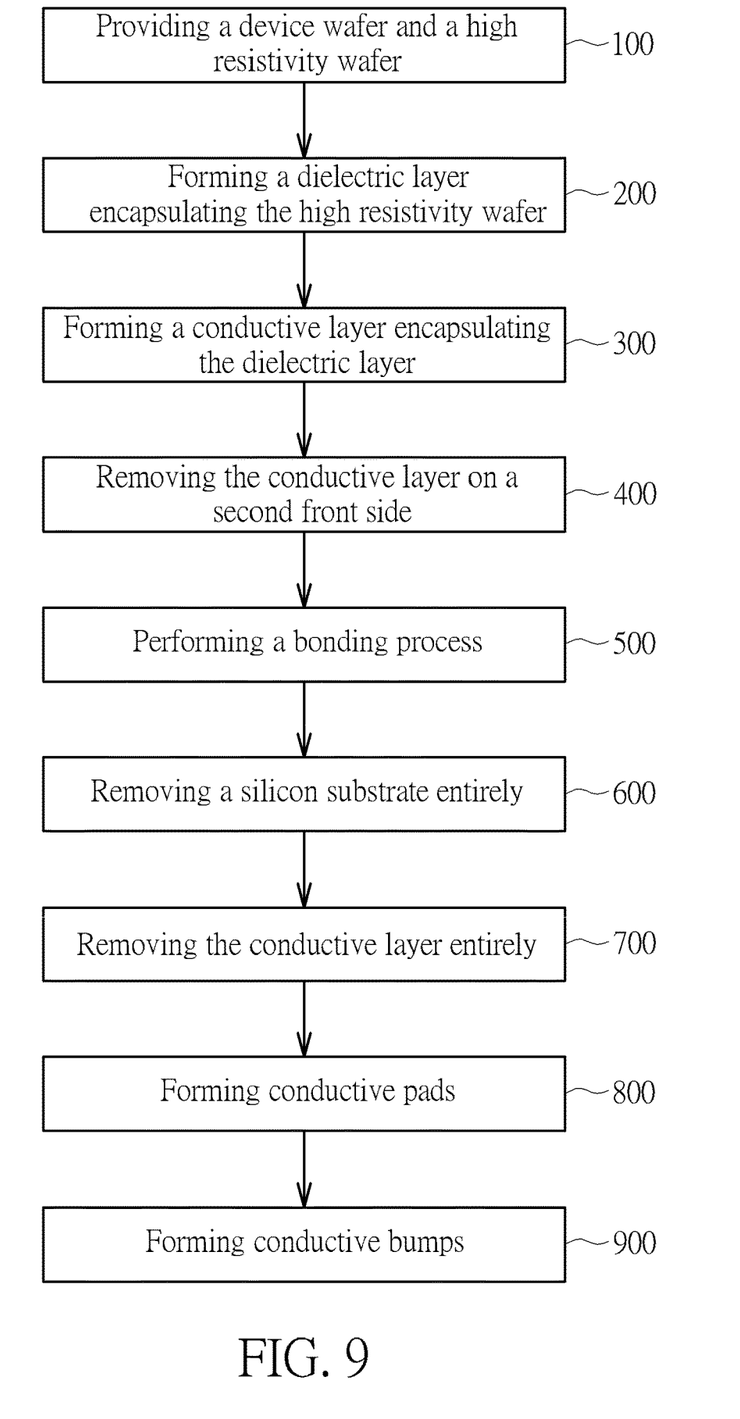
FIG. 9 depicts a flow chart of a method of bonding a high resistivity wafer according to a preferred embodiment of the present invention.

FIG. 1 to FIG. 8 depict a method of bonding a high resistivity wafer according to a preferred embodiment of the present invention. FIG. 9 depicts a flow chart of a method of bonding a high resistivity wafer according to a preferred embodiment of the present invention. As shown in FIG. 1 and FIG. 9, a step 100 is performed. The step 100 includes providing a device wafer 10 and a high resistivity wafer 12. The wafer device 10 includes a first front side 14 and a first back side 16. The first front side 14 is opposed to the first back side 16. The high resistivity wafer 12 includes a second front side 18 and a second back side 20. It is noteworthy that the high resistivity wafer 12 consists of an insulating material. In other words, the high resistivity wafer 12 only includes the insulating material mentioned above. According to a preferred embodiment of the present invention, the insulating material may be glass, quartz, silicon nitride or other insulating materials. The resistivity of the high resistivity wafer 12 is greater than $10^9$ Ohm meters ($\Omega$m), i.e. the resistivity of the insulating material for forming the high resistivity wafer 12 is greater than $10^9$ $\Omega$m. Moreover, the coefficient of thermal expansion of the insulating material is close to the coefficient of thermal expansion of silicon. Conventionally, the wafer used in the semiconductor field has a resistivity between 30 and 200 $\Omega$m, i.e. the conventional wafer has a resistivity smaller than 200 $\Omega$m. The high resistivity wafer 12 has a resistivity which is much greater than the conventional wafer; therefore, the wafer 12 can be defined as high resistive.

Continue to refer to FIG. 1. The device wafer 10 includes a conductive silicon layer 22, a silicon oxide layer 24 and a silicon substrate 26. The silicon oxide layer 24 is disposed between the conductive silicon layer 22 and the silicon substrate 26. It is noteworthy that the silicon substrate 26 is preferably composed of normal polysilicon which has a resistivity smaller than 30 Ωm. The device wafer 10 can be fabricated by forming the silicon oxide layer 24 in the silicon substrate 26 through an ion implantation process, followed by forming the conductive silicon layer 22 through another ion implantation process. In the step 100, the top surface of the conductive silicon layer 22 serves as the first front side 14. The bottom surface of the silicon substrate 26 serves as the first back side 16. Moreover, a semiconductor device 28 such as a transistor is disposed at the first front side 14. The transistor includes a gate structure 30 and two source/drain doping regions 32a/32b. Two source/drain doping regions 32a/32b are disposed in the conductive silicon layer 22 at two sides of the gate structure 30. A shallow trench isolation (STI) 34 is disposed in the conductive silicon layer 22 around the transistor. An interlayer dielectric layer 36 covers and contacts the first front side 14 of the device wafer 10. A metal interconnection 38 is disposed within the interlayer dielectric layer 36. The metal interconnection 38 is formed by several metal pads such as metal pads 38a/38b. Two conductive plugs 40a/40b are respectively disposed on the source/drain doping regions 32a/32b. The conductive plug 40a contacts the metal pad 38a, and the conductive plug 40b contacts the metal pad 38b.

Figure 2:
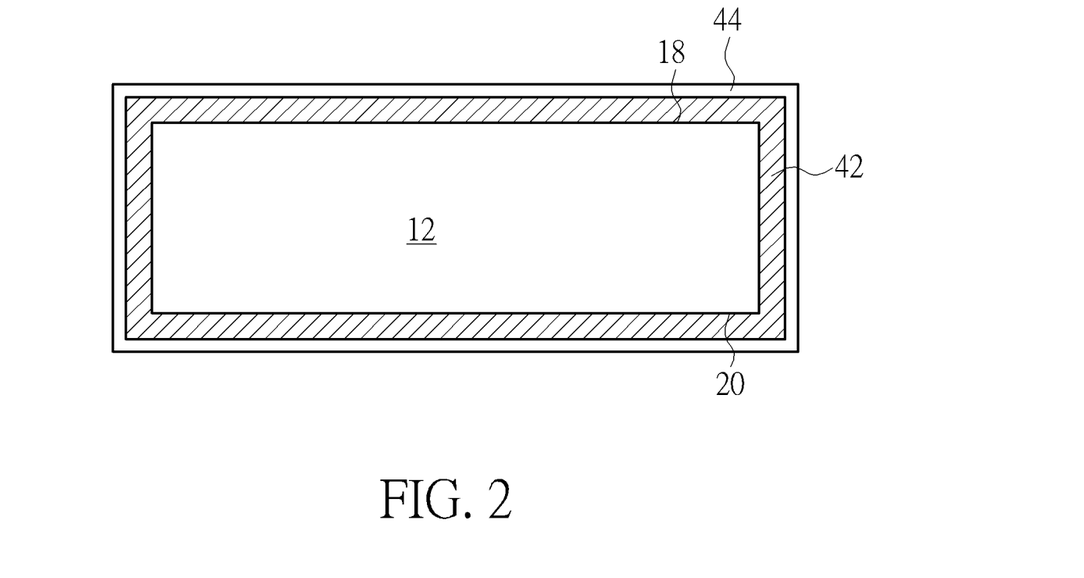
FIG. 2 depicts a fabricating stage subsequent to FIG. 1.

As shown in FIG. 2 and FIG. 9, a step 200 is performed by forming a dielectric layer 42 which contacts and encapsulates the high resistivity wafer 12. The dielectric layer 42 includes silicon oxide. According to a preferred embodiment of the present invention, the dielectric layer 42 consists of silicon oxide only; i.e. the dielectric layer 42 does not include other materials except silicon oxide. Next, a step 300 is performed to form a conductive layer 44 encapsulating and contacting the dielectric layer 42. The conductive layer 44 may be polysilicon, metal or alloy. When the conductive layer 44 is polysilicon, the polysilicon on the second back side 20 of the high resistive wafer 12 is implanted with dopants such as arsenic (As), boron (B) or phosphorus (P) to make the polysilicon become conductive. The metal which can be used for the conductive layer 44 includes titanium (Ti), tantalum (Ta), aluminum (Al), tungsten (W) or copper (Cu). The alloy which can be used for the conductive layer 44 includes titanium nitride (TiN), titanium carbide (TiC), tantalum nitride (TaN) or titanium/tungsten (Ti/W). The dielectric layer 42 and the conductive layer 44 can be respectively formed in a furnace by deposition processes. When the high resistive wafer 12 is glass or quartz, the resistive wafer 12 is transparent, and cannot be detected and located by a semiconductor machine. Therefore, the high resistive wafer 12 of the present invention is encapsulated by the dielectric layer 42 and the conductive layer 44 to make the high resistive wafer 12 become opaque, allowing the semiconductor machine to locate the high resistive wafer 12. The high resistive wafer 12 is further encapsulated by the conductive layer 44, so the conductive layer 44 on the second back side 20 of the high resistive wafer 12 can be adhered on the wafer stage through electrostatic charge. In this way, the high resistive wafer 12 is fixed on the wafer stage. The dielectric layer 42 serves as a barrier between the high resistive wafer 12 and the conductive layer 44. The attachment ability of the conductive layer 44 to the glass or quartz is worse, whereas the attachment ability of the conductive layer 44 to the dielectric layer 42 is better; therefore, the dielectric layer 42 is attached on the high resistive wafer 12 followed by attaching the conductive layer 44 on the dielectric layer 42.

Figure 3:
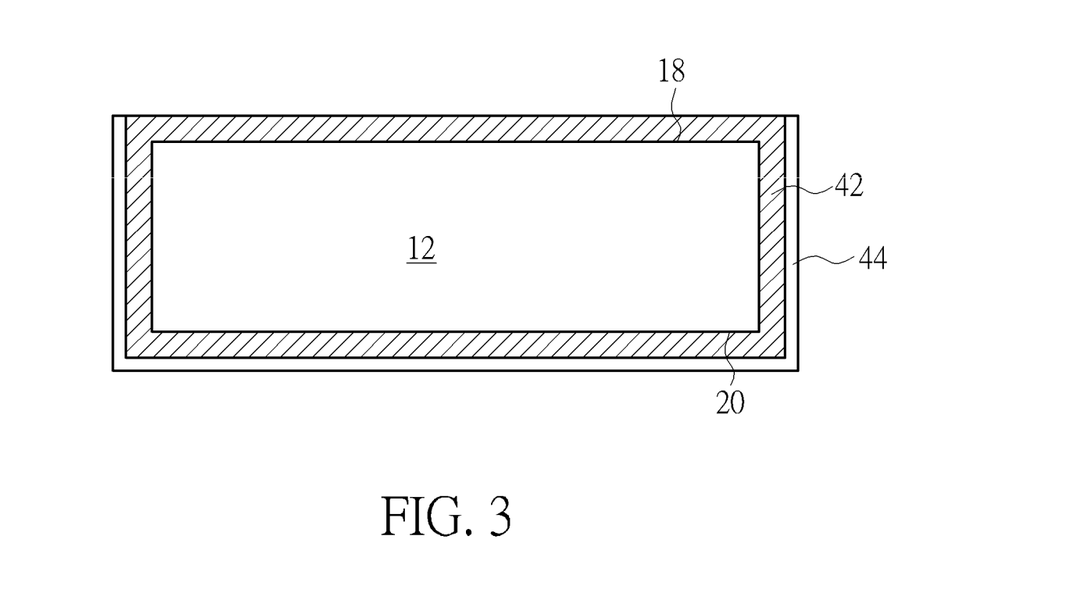
FIG. 3 depicts a fabricating stage subsequent to FIG. 2.
Figure 4:
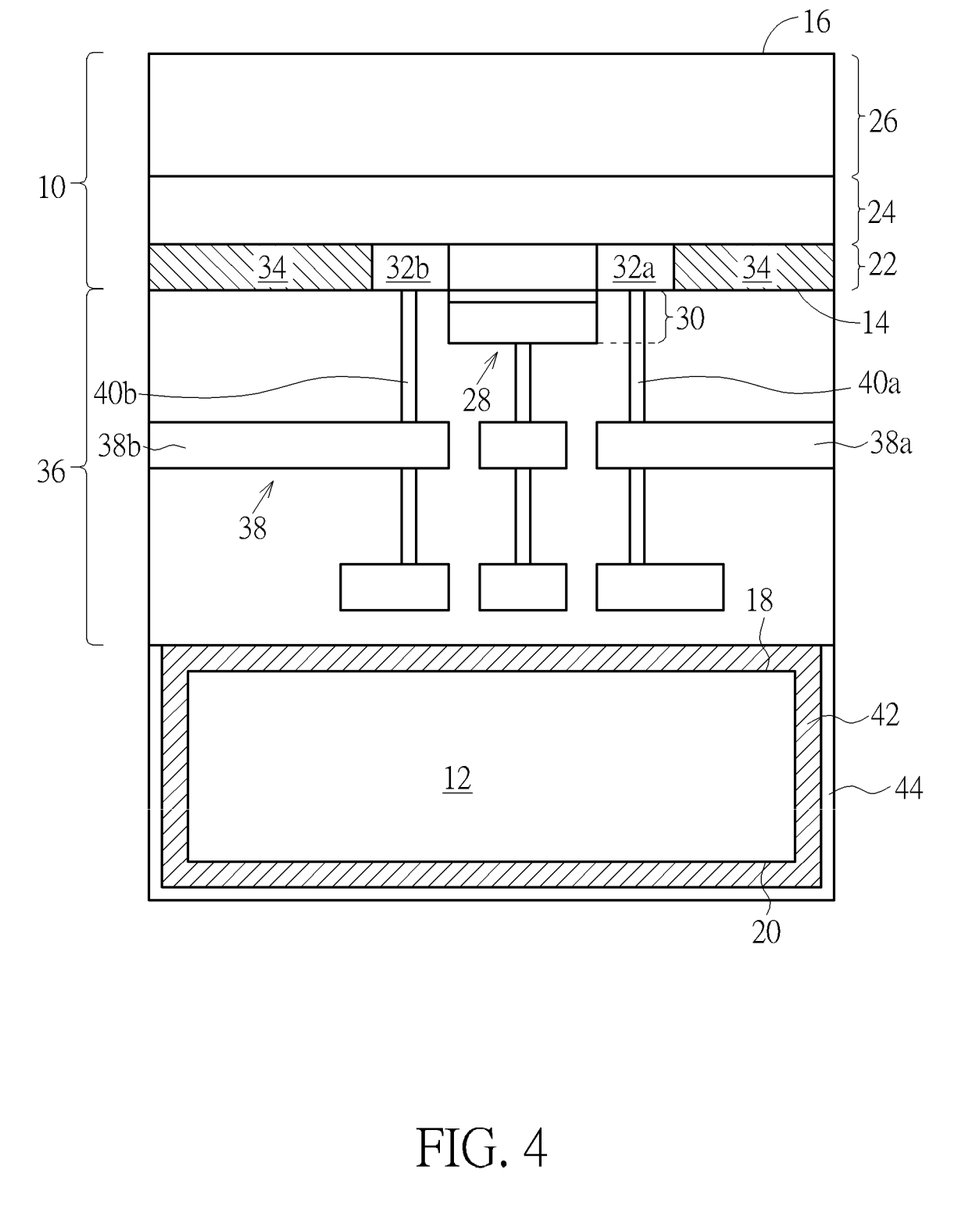
FIG. 4 depicts a fabricating stage subsequent to FIG. 3.
Figure 5:
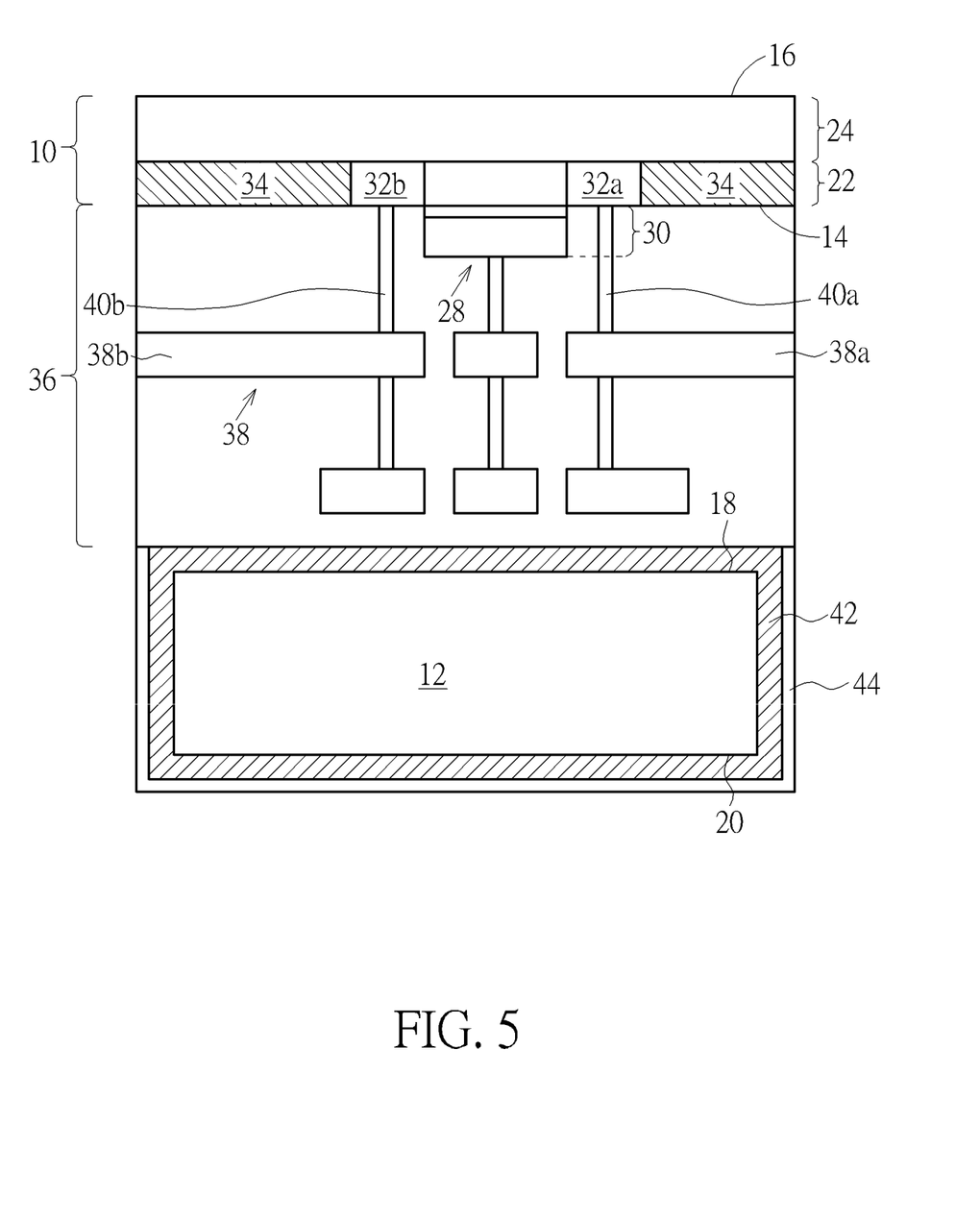
FIG. 5 depicts a fabricating stage subsequent to FIG. 4.

As shown in FIG. 3 and FIG. 9, a step 400 is performed. The conductive layer 44 on the second front side 18 is removed and the dielectric layer 42 on the second front side 18 is exposed. The conductive layer 44 can be removed by a dry etching process. As shown in FIG. 4 and FIG. 9, a step 500 is performed by performing a bonding process. During the bonding process, the dielectric layer 42 on the second front side 18 is bonded to the interlayer dielectric layer 36. In this way, the device wafer 10 and the high resistivity wafer 12 are bonded together. The bonding process is preferably performed at 300° C. As shown in FIG. 5 and FIG. 9, a step 600 is performed to entirely remove the silicon substrate 26 in the device wafer 10 and to expose the silicon oxide layer 24. At this point, the bottom of the silicon oxide layer 24 serves as the first back side 16 of the device wafer 10. The top surface of the conductive silicon layer 22 still serves as the first front side 14. The silicon substrate 26 can be removed by a chemical mechanical planarization or a wet etching process and takes the bottom of the silicon oxide layer 24 as a stop layer.

Figure 6:
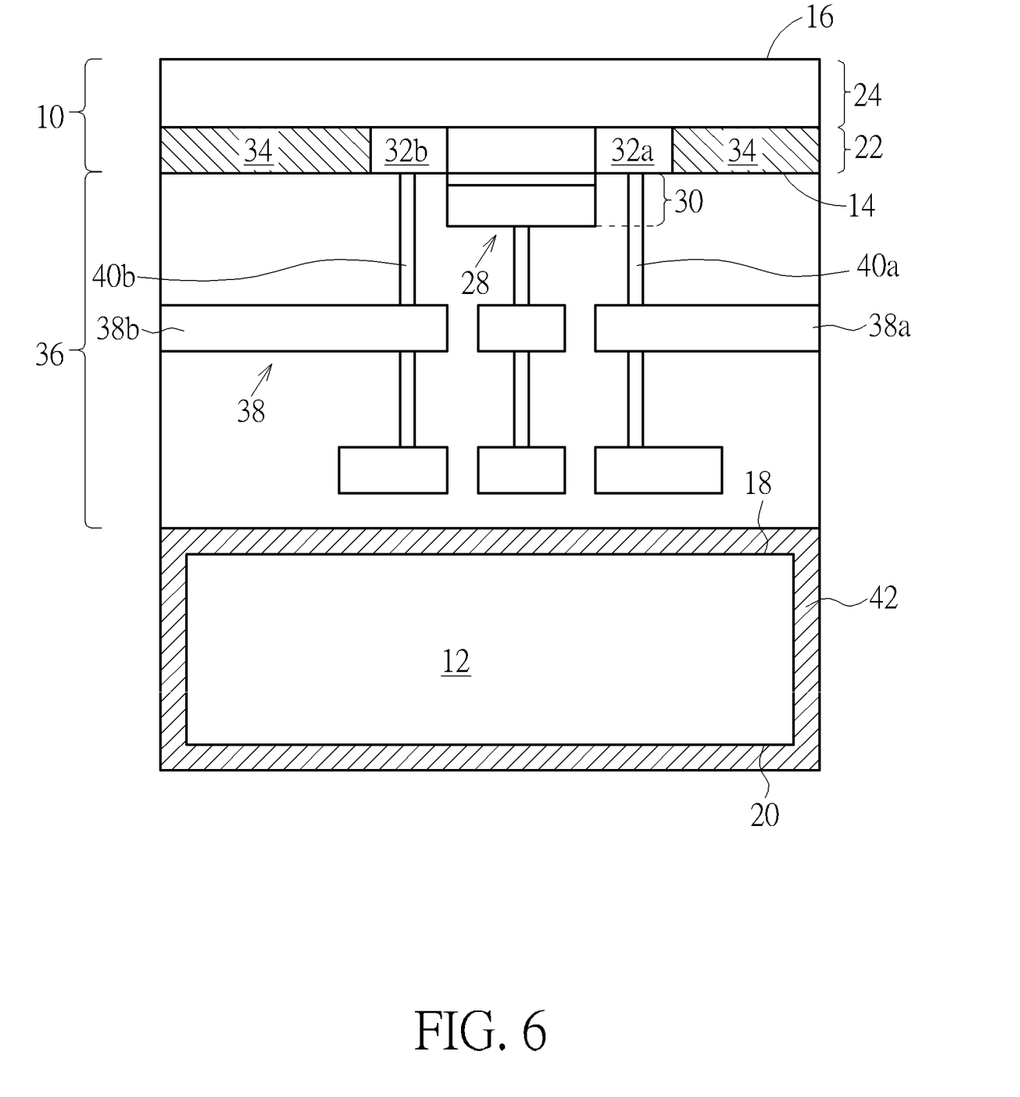
FIG. 6 depicts a fabricating stage subsequent to FIG. 5.

As shown in FIG. 6 and FIG. 9, a step 700 is performed by entirely removing the conductive layer 44. The conductive layer 44 may be removed by a wet etching process. Because there is a wafer edge (not shown) on the device wafer 10, and there is no semiconductor device 28 or metal interconnection 38 disposed within the wafer edge, even when a wet etching process is used in the step 700, the etchant only contacts the wafer edge, and the semiconductor device 28 and the metal interconnection 38 will not be damaged. As shown in FIG. 7 and FIG. 9, a step 800 is performed by forming at least one conductive pad on the back side (the first back side 16 of the device wafer 10) of the silicon oxide layer 24. FIG. 7 takes two conductive pads 48a/48b as an example. Each of the conductive pads 48a/48b respectively electrically connects to the metal interconnection 38 through via plugs 50a/50b. Because the metal layer 38a contacts the conductive plug 40a, the metal layer 38b contacts the conductive plug 40b, the two conductive pads 48a/48b respectively electrically connect to the source/drain doping regions 32a/32b through the metal interconnection 38. Next, a step 900 is performed by forming a protective layer 50 covering the conductive pads 48a/48b. Next, two openings are formed in the protective layer 50 to expose the conductive pads 48a/48b. As shown in FIG. 8 and FIG. 9, conductive bumps 52 are formed to contact the conductive pads 48a/48b. The material of the conductive pads 48a/48b and conductive bumps 52 can independently be titanium (Ti), tantalum (Ta), aluminum (Al), tungsten (W) or copper (Cu). At this point, the semiconductor structure 54 with a high resistivity wafer is completed.

As shown in FIG. 8, a semiconductor structure 54 with a high resistivity wafer of the present invention includes a device wafer 10. The device wafer 10 includes a conductive silicon layer 22 and a silicon oxide layer 24. The device wafer 10 includes a first front side 14 and a first back side 16. In detail, the bottom of the silicon oxide layer 24 serves as the first back side 16. The top surface of the conductive silicon layer 22 serves as the first front side 14. A semiconductor element 28 such as a transistor is disposed on the first front side 14. The semiconductor element 28 includes a first gate structure 30 and two source/drain doping regions 32a/32b. The source/drain doping regions 32a/32b are respectively in the conductive silicon layer 22 at two sides of the gate structure 30. An interlayer dielectric layer 36 covers the first front side 14 and the semiconductor element 28. Furthermore, the semiconductor structure 54 with a high resistivity wafer also includes a high resistivity wafer 12. The high resistivity wafer 12 consists of an insulating material. The insulating material may be glass, quartz, silicon nitride or other insulating materials. The resistivity of the high resistivity wafer 12 is greater than $10^9$ Ωm, i.e. the resistivity insulating material used for forming the high resistivity wafer 12 should be greater than $10^9$ Ωm. A dielectric layer 42 encapsulates and contacts the high resistivity wafer 12. The dielectric layer 42 also contacts the interlayer dielectric layer 36. The dielectric layer 42 and the interlayer dielectric layer 36 are both between the high resistivity wafer 12 and the device wafer 10. The dielectric layer includes silicon oxide. Moreover, a metal interconnection 38 is disposed within the interlayer dielectric layer 36. The metal interconnection 38 includes numerous metal layers such as metal layers 38a/38b. A conductive plug 40a is disposed on the source/drain doping region 32a and contacts the metal layer 38a. A conductive plug 40b is disposed on the source/drain doping region 32b and contacts the metal layer 38b. At least one conductive pad, such as conductive pads 48a/48b are disposed on the interlayer dielectric layer 36 and at the first back side 16 of the device wafer 10. The first back side 16 contacts the conductive pads 48a/48b. Two via plugs 50a/50b respectively contact the conductive pads 48a/48b to make the conductive pads 48a/48b electrically connect to the metal interconnection 38. Two conductive pads 48a/48b respectively electrically connect to the source/drain doping regions 32a/32b through the metal interconnection 38.

The resistivity of the high resistivity wafer 12 is preferably greater than $10^9$ Ωm which is greater than the resistivity of the standard radio frequency (RF) silicon-on-insulator (SOI) substrate having a resistivity not greater than 200 Ωm. Therefore, the semiconductor structure 54 with a high resistivity wafer of the present invention can provide improved efficiency for radio frequency devices. Moreover, the silicon substrate in a standard RF SOI substrate has a higher resistivity than a general silicon substrate. For example, the silicon substrate in a standard RF SOI substrate usually has a resistivity between 30 and 200 Ωm to provide better efficiency. The silicon substrate with higher resistivity is difficult to fabricate and costly, however. In the present invention, the general silicon substrate is used in combination with glass, quartz or silicon nitride to increase the resistivity. Materials for fabricating the high resistivity wafer are easy to obtain, and the fabricating process of the present invention is simple. Furthermore, the high resistivity wafer of the present invention can provide higher resistivity than the conventional RF SOI substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure with a high resistivity wafer, comprising:
    a device wafer comprising a front side and a back side;
    a semiconductor element disposed on the front side;
    an interlayer dielectric layer covering the front side;
    a high resistivity wafer consisting of an insulating material; and
    a dielectric layer encapsulating the high resistivity wafer, wherein the dielectric layer contacts the interlayer dielectric layer.

2. The semiconductor structure with a high resistivity wafer of claim 1, wherein the insulating material comprises glass, quartz or silicon nitride.

3. The semiconductor structure with a high resistivity wafer of claim 1, wherein the resistivity of the high resistivity wafer is greater than $10^9$ Ωm.

4. The semiconductor structure with a high resistivity wafer of claim 1, wherein the dielectric layer comprises silicon oxide.

5. The semiconductor structure with a high resistivity wafer of claim 1, further comprising a metal interconnection disposed in the interlayer dielectric layer.

6. The semiconductor structure with a high resistivity wafer of claim 1, wherein the device wafer comprises a silicon oxide layer and a conductive silicon layer, a bottom of the silicon oxide layer is the back side, and a top surface of the conductive silicon layer is the front side.

7. A semiconductor structure with a high resistivity wafer, comprising:
    a device wafer comprising a front side and a back side;
    a semiconductor element disposed on the front side;
    an interlayer dielectric layer covering the front side;
    a metal interconnection disposed in the interlayer dielectric layer;
    a high resistivity wafer consisting of an insulating material;
    a dielectric layer encapsulating the high resistivity wafer, wherein the dielectric layer contacts the interlayer dielectric layer; and
    a conductive pad disposed on the back side, wherein the conductive pad electrically connects to the metal interconnection.

8. The semiconductor structure with a high resistivity wafer of claim 7, wherein the insulating material comprises glass, quartz or silicon nitride.

9. The semiconductor structure with a high resistivity wafer of claim 7, wherein the resistivity of the high resistivity wafer is greater than $10^9$ Ωm.

10. The semiconductor structure with a high resistivity wafer of claim 7, wherein the dielectric layer comprises silicon oxide.

11. The semiconductor structure with a high resistivity wafer of claim 7, wherein the device wafer comprises a silicon oxide layer and a conductive silicon layer, a bottom of the silicon oxide layer is the back side, and a top surface of the conductive silicon layer is the front side.

12. A method of bonding a high resistivity wafer, comprising:
    providing a device wafer and a high resistivity wafer, wherein the device wafer comprises a first front side, the high resistivity wafer comprises a second front side and the high resistivity wafer consists of an insulating material, and wherein an interlayer dielectric layer covers the first front side;
    forming a dielectric layer contacting and encapsulating the high resistivity wafer;
    forming a conductive layer encapsulating the dielectric layer;
    removing the conductive layer on the second front side to expose the dielectric layer on the second front side;
    performing a bonding process comprising bonding the dielectric layer on the second front side to the interlayer dielectric layer; and
    after the bonding process, entirely removing the conductive layer.

13. The method of bonding a high resistivity wafer of claim 12, wherein the conductive layer is polysilicon.

14. The method of bonding a high resistivity wafer of claim 13, wherein the polysilicon comprises dopants.

15. The method of bonding a high resistivity wafer of claim 12, wherein the conductive layer is metal or alloy.

16. The method of bonding a high resistivity wafer of claim 12, wherein the device wafer comprises a conductive silicon layer, a silicon oxide layer and a silicon substrate, and the silicon oxide layer is disposed between the conductive silicon layer and the silicon substrate.

17. The method of bonding a high resistivity wafer of claim 16, further comprising:
   after the bonding process and before entirely removing the conductive layer, removing the silicon substrate entirely; and
   after entirely removing the conductive layer, forming a conductive pad on the silicon oxide layer, wherein the conductive pad electrically connects to a metal interconnection within the interlayer dielectric layer.

18. The method of bonding a high resistivity wafer of claim 12, wherein the insulating material comprising glass, quartz or silicon nitride.

19. The method of bonding a high resistivity wafer of claim 12, wherein the resistivity of the high resistivity wafer is greater than $10^9$ $\Omega$m.

20. The method of bonding a high resistivity wafer of claim 12, wherein the dielectric layer comprises silicon oxide.

\* \* \* \* \*